(12) United States Patent
Hardeman

(10) Patent No.: US 8,692,978 B2
(45) Date of Patent: Apr. 8, 2014

(54) LITHOGRAPHIC APPARATUS AND DEVICE MANUFACTURING METHOD

(75) Inventor: Toon Hardeman, 's-Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 260 days.

(21) Appl. No.: 12/792,476

(22) Filed: Jun. 2, 2010

(65) Prior Publication Data

US 2010/0321665 A1 Dec. 23, 2010

Related U.S. Application Data

(60) Provisional application No. 61/218,676, filed on Jun. 19, 2009.

(51) Int. Cl.
*G03B 27/32* (2006.01)

(52) U.S. Cl.
USPC ............ 355/68; 355/72; 355/75; 355/77

(58) Field of Classification Search
None
See application file for complete search history.

(56) References Cited

U.S. PATENT DOCUMENTS

| 5,497,226 | A | 3/1996 | Sullivan |
| 5,610,719 | A * | 3/1997 | Allen et al. .................. 356/614 |
| 7,119,622 | B2 | 10/2006 | Sato |
| 8,134,688 | B2 * | 3/2012 | Shibazaki ...................... 355/68 |
| 2002/0074487 | A1 | 6/2002 | Ito et al. |
| 2004/0263846 | A1 * | 12/2004 | Kwan ............................ 356/399 |
| 2007/0052976 | A1 * | 3/2007 | Pril et al. ...................... 356/616 |
| 2007/0180725 | A1 * | 8/2007 | Drescher et al. ................ 33/707 |
| 2007/0281149 | A1 | 12/2007 | Martens et al. |
| 2008/0042051 | A1 | 2/2008 | Sidor et al. |
| 2008/0094593 | A1 * | 4/2008 | Shibazaki ........................ 355/53 |
| 2008/0240501 | A1 | 10/2008 | Van Der Wijst et al. |
| 2008/0319569 | A1 * | 12/2008 | Loopstra et al. .............. 700/110 |
| 2010/0214566 | A1 * | 8/2010 | Brill et al. ..................... 356/401 |
| 2010/0321665 | A1 * | 12/2010 | Hardeman ....................... 355/72 |

FOREIGN PATENT DOCUMENTS

TW 200830360 7/2008

OTHER PUBLICATIONS

Singapore Written Opinion and Search Report dated Jun. 27, 2012 in corresponding Singapore Patent Application No. 201003831-3.
Taiwan Office Action dated Apr. 19, 2013 in corresponding Taiwan Patent Application No. 099117465.

* cited by examiner

*Primary Examiner* — Thomas R Artman
(74) *Attorney, Agent, or Firm* — Pillsbury Winthrop Shaw Pittman LLP

(57) ABSTRACT

A method of determining a defect in a grid plate of an encoder-type position measurement system, the method including providing an encoder-type position measurement system to measure a position of a movable object with respect to another object, the encoder-type position measurement system including a grid plate and an encoder head, measuring a quantity of light reflected on each of the two or more detectors, using a combined light intensity of the reflected light on the two or more detectors to determine a reflectivity signal representative for the reflectivity of the grid plate at the measurement location, and determining a presence of a defect at the measurement location on the basis of the reflectivity signal of the grid plate.

23 Claims, 2 Drawing Sheets

LITHOGRAPHIC APPARATUS AND DEVICE MANUFACTURING METHOD

CROSS REFERENCE TO RELATED APPLICATIONS

This application claims priority and benefit under 35 U.S.C. §119(e) to U.S. Provisional Patent Application No. 61/218,676, entitled "Lithographic Apparatus and Device Manufacturing Method", filed on Jun. 19, 2009. The content of that application is incorporated herein in its entirety by reference.

FIELD

The present invention relates to a method of determining a defect in a grid plate of an encoder-type position measurement system, a position measurement method using an encoder-type position measurement system, and a lithographic apparatus including such an encoder-type position measurement system.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the known lithographic apparatus, a position sensor is used to measure the position of movable objects, such as the substrate table and the patterning device support. This position is measured with high accuracy and usually in multiple degrees of freedom.

A position measurement system used in a stage system, such as a lithographic apparatus stage system is an encoder-type sensor including an encoder head and a grid plate. The encoder head includes a light source to emit light towards a measurement location on the grid plate and a number of detectors to receive the light reflected by the grid plate. On the basis of phase differences between the light received by the two or more detectors, the position of the movable object with respect to the grid plate may be determined.

Such encoder-type position measurement system may provide a position of a movable object with high accuracy and in multiple degrees of freedom. One encoder head may be capable of determining a position in one or more degrees of freedom. The encoder system is a two dimensional encoder measurement system wherein the encoder head can measure its position with respect to the grid plate in both a direction parallel to the grid plate and a direction perpendicular to the direction of the grid plate. Three of such encoder heads provide a system which can measure the position of the movable object with respect to the grid plate in six degrees of freedom.

Due to a manufacturing process of the grid plate, the grid or grating may include a defect. In particular, the reflectivity of the grid plate may deviate at particular location(s) due to such defect. Such defects may lead to inaccurate position measurements and are therefore undesired. To avoid inaccurate position measurements, the requirements during a production process of a grid plate are very high, and only a limited number of produced grid plate have sufficient quality to be used in a lithographic apparatus. As a result, the costs for grid plates are considerable high.

Furthermore, during use, defects may come into existence, for instance due to contamination, cleaning or physical damage. Also these defects may lead to inaccurate position measurement of a movable object for which it is used.

SUMMARY

It is desirable to provide a method of determining a defect in a grid plate of an encoder-type position measurement system, and a position measurement method using an encoder-type position measurement system, wherein the presence of defects in a grid plate may be taken into account. Furthermore, it is desirable to provide a lithographic apparatus including an encoder-type position measurement system for carrying out such method.

According to an embodiment of the invention, there is provided a method of determining a defect in a grid plate of an encoder-type position measurement system, the method including providing at least one encoder-type position measurement system to measure a position of a movable object with respect to another object, the encoder-type position measurement system including a grid plate and an encoder head, wherein the grid plate is mounted on one of the movable object and the other object, and the encoder head is mounted on the other of the movable object and the other object, the encoder head at least including a radiation source configured to emit a radiation beam towards a measurement location on the grid plate and two or more detectors each configured to measure a quantity of radiation beam reflected by the grid plate; measuring a quantity of radiation beam reflected on each of the two or more detectors; using a combined radiation beam intensity of the reflected radiation beam on the two or more detectors to determine a reflectivity signal representative for the reflectivity of the grid plate at the measurement location, and determining a presence of a defect at the measurement location on the basis of the reflectivity signal of the grid plate.

According to an embodiment of the invention, there is provided a position measurement method using an encoder-type position measurement system, the method including: providing at least one encoder-type position measurement system to measure a position of a movable object with respect to another object, the encoder-type position measurement system including a grid plate and an encoder head, wherein the grid plate is mounted on one of the movable object and the other object, and the encoder head is mounted on the other of the movable object and the other object, the encoder head at least including a radiation source configured to emit a radiation beam towards a measurement location on the grid plate and two or more detectors each configured to measure a quantity of radiation beam reflected by the grid plate; and measuring a quantity of radiation beam reflected on each of the two or more detectors; determining a position of the encoder head with respect to the grid plate on the basis of the measured quantities of radiation beam; and compensating the effect of a defect in the grid plate in the measured position.

According to an embodiment of the invention, there is provided a method of determining a defect in a grid plate of an encoder-type position measurement system, the method including: providing at least one encoder-type position measurement system to measure a position of a movable object with respect to another object including a grid plate and an encoder head, wherein the grid plate is mounted on one of the movable object and the other object, and the encoder head is mounted on the other of the movable object and the other object, the encoder head at least including a radiation source configured to emit a radiation beam towards a measurement location on the grid plate and two or more detectors each configured to measure a quantity of radiation beam reflected by the grid plate, and determining at least two position error maps for at least two different angles of the two or more detectors with respect to the grid plate and extracting a defect map from the at least two position error maps.

According to an embodiment of the invention, there is provided a lithographic apparatus including: an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate, and a position measurement system to measure a position of a movable object of the lithographic apparatus, the position measurement system including at least one encoder system including a grid plate and an encoder head, the encoder head at least including two detectors to measure a radiation beam reflected by the grid plate at a measurement location, wherein the encoder system is configured to use a combined radiation beam intensity based on the reflected radiation beam measured by the two or more detectors to determine the reflectivity of the grid plate at the measurement location.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
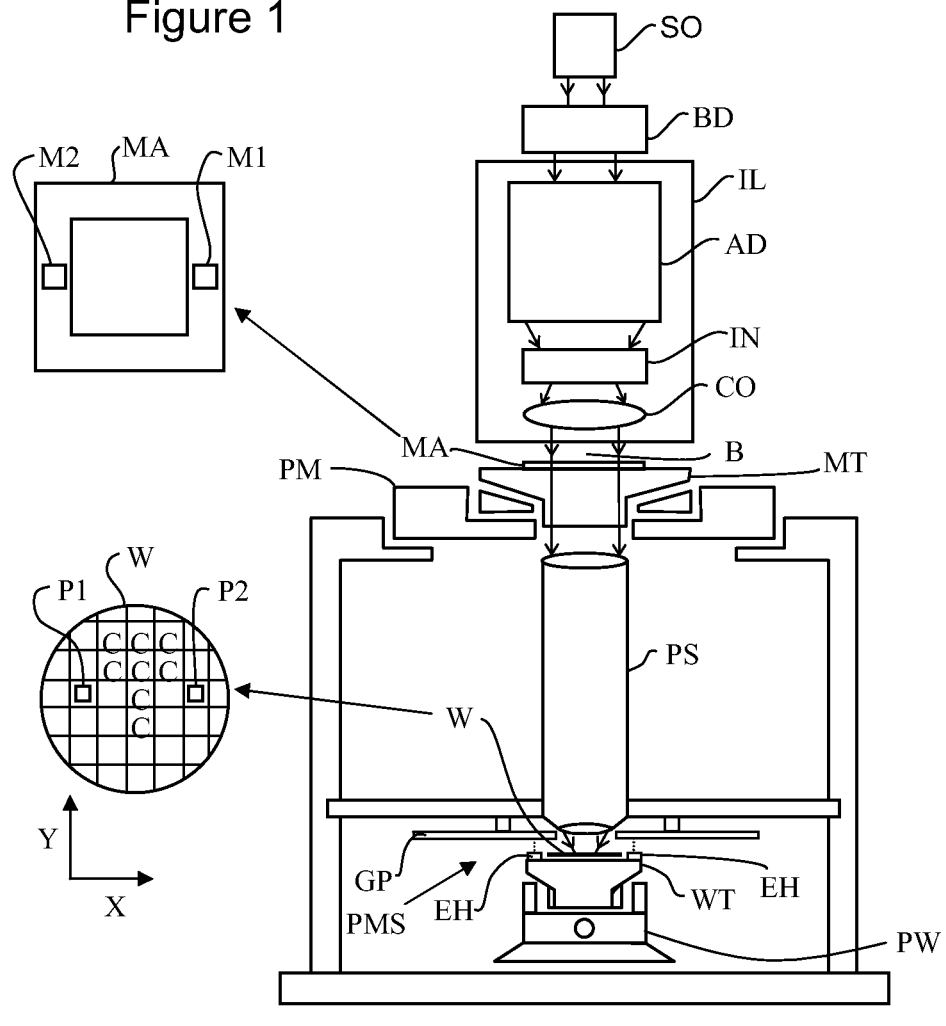
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor, the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In the lithographic apparatus of FIG. 1, an encoder-type position measurement system PMS is provided to measure a position of the substrate table WT. The encoder-type position measurement system is configured to determine the position of the substrate table WT in six degrees of freedom. For this reason, multiple encoder heads EH are provided on the substrate table WT, and a grid plate GP is mounted on a frame of the lithographic apparatus, for instance the so-called metrology frame.

The grid plate GP is an object which includes a grid or grating, and does not have to be plate shaped. The grid plate GP may be any object provided with a grid or grating which is used to measure the position of a movable object using an encoder head EH.

The encoder head EH shown in FIG. 1 is capable of determining its position with respect to the grid plate in two directions one substantially parallel to the grid or grating on the grid plate GP, and one substantially perpendicular to the grid plate GP. In an alternative embodiment of a position measurement system for a movable object of a lithographic apparatus, one or more encoder heads may be provided on a frame of the lithographic apparatus and one or more grid plates may be provided on the movable object.

Figure 2:
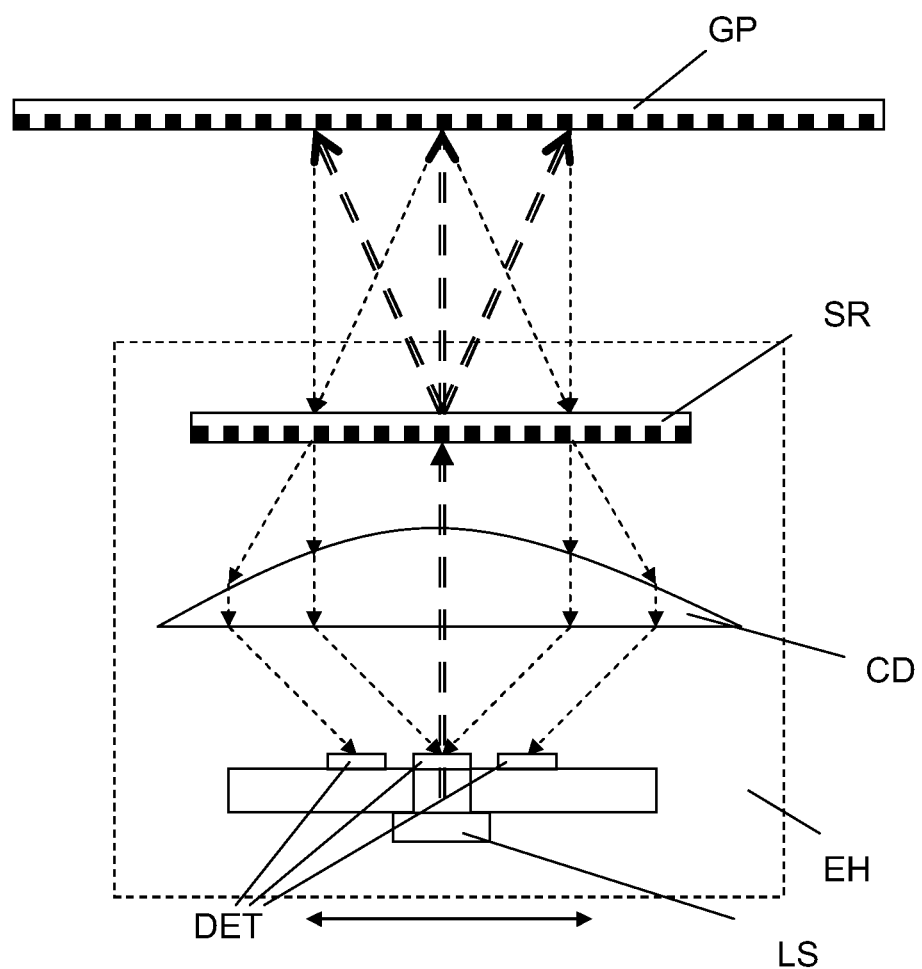
FIG. 2 depicts an embodiment of an encoder-type measurement system.

FIG. 2 shows a schematic view of an embodiment of an encoder head EH and a grid plate GP. Such combination of encoder head EH and grid plate GP is for instance available from DR. JOHANNES HEIDENHAIN GmbH, Traunreut, Deutschland. The encoder head EH includes a light source LS, which can be broadly termed "radiation source", a condenser CD to condense light or a radiation beam emitted by the light source, a scanning reticle SR, and three detectors DET, for instance voltaic cells.

The light source or radiation source LS emits light or a radiation beam towards the scanning reticle SR. The scanning reticle SR includes a grating which corresponds to the grating provided on the grid plate GP. When a light or radiation wave passes through the scanning reticle SR, it is diffracted into three partial waves of the orders +1, 0, and −1, with approximately equal luminous intensity.

The partial waves are diffracted by the grid plate GP such that most of the luminous intensity is found in the reflected diffraction orders +1 and −1. These partial waves meet again at the phase grating of the scanning reticle SR where they are diffracted again and interfere. This produces essentially three wave trains that leave the scanning reticle SR at different angles.

The three wave trains which are received by the three detectors DET, which may convert the alternating light or radiation beam intensity into electrical signals. On the basis of these electric signals, a change of position of the grid plate GP in a direction parallel with respect to the encoder head EH may be determined, and thus the relative position of the encoder head EH with respect to the grid plate GP in this direction can be determined with high accuracy.

In the position measurement, the change in light radiation beam intensity as captured by each detector is used to determine a change in position. It is desirable that no defects be present in the grid plate, or at least that defects present in the grid plate GP be known so that the defects can be taken into account. An embodiment of the present invention provides a method for detecting defects in a grid plate, and for taking into account such defects.

The reflectivity of the grid plate is related to the amount of light or radiation beam that is falling on the detectors DET. Thus, by measuring a quantity of light or radiation beam received on the three detectors DET, and using a combined light or radiation beam intensity of the reflected light or radiation beam, for instance the total amount of light or radiation beam falling on the detectors, a signal representative for the reflectivity of the grid plate at the measurement location may be determined.

It is noted that instead of the total quantity of light or radiation beam that is received by the three detectors, also another combination of light or radiation beam intensities received by the detectors may be used to determine a signal representative for the reflectivity of the grid plate GP.

This reflectivity of the grid plate GP may be used to determine the presence of a defect at the measurement location, i.e. the location of the grid plate GP where the light or radiation beam of the light or radiation source LS is reflected by the grid plate GP. Generally, a defect in the grid plate GP will result in a variation of the reflectivity of the grid plate GP at the location of the defect. Usually the reflectivity at the location of the defect will be smaller than at a location on the grid plate GP without a defect. Thus, for instance, it may be determined that a defect is present when the reflectivity of the grid plate GP is below a threshold level, while the normal reflectivity of this grid plate GP is above this threshold value. When the location of such defect is known, an inaccurate position measurement at that measurement location may be predicted. The reflectivity of the grid plate may be dependent on the direction in which the reflectivity is measured.

By measuring the reflectivity of the grid plate at multiple measurement locations, preferably over the whole surface of the grid plate GP, a reflectivity profile of the grid plate GP may be provided. By comparing such reflectivity profile with a default profile and applying a threshold operation, a defect map of the grid plate GP may be determined. Such defect map provides information on the presence and location of defects on the grid plate GP. When this grid plate GP is used during actual position measurement, it is known at which measurement locations incorrect position measurement may be expected.

The reflectivity profile and/or defect map of a grid plate may be stored and compared with other reflectivity profile and/or defect map. Any differences between reflectivity profiles and/or defect maps may point at a new defect on the grid plate GP. Such new defect may be taken into account during position measurement. Also, it can be used to determine whether the quality of the grid plate decreases. When the number or size of defects is larger than a maximum number or size it may be decided to install a new grid plate GP in the position measurement system.

It is noted that the amount of light or radiation beam reflected on the detectors also depends on the angle of the encoder head EH with respect to the grid plate GP. Therefore, it is desirable that the angle of the encoder head be constant during the determination of a reflectivity profile of the grid plate.

The method according to an embodiment of the invention may also be used for a defect detection method for new defects in the grid plate. In such method the measured reflectivity of the grid plate during actual position measurement may be compared with a previously measured reflectivity at the same measurement location. When the reflectivity of the grid plate substantially differs, a defect may be present in the grid plate GP.

The method of an embodiment of the invention may also be applied for online detection of new defects in a grid plate. In such method the reflectivity signal of the encoder head which is measured during actual position measurement during the lithographic process may be compared with previously measured reflectivity signals. In particular the correlation between the actual reflectivity signal and previously measured reflectivity signals may be determined. This correlation may be compared with a threshold. When the threshold is exceeded, a defect may be detected at the actual measurement location. Instead of the reflectivity signal also another output signal of the encoder head may be used to detect a defect in the grid plate, for instance the position signal provided by the encoder head.

A defect in the grid plate GP may lead to inaccurate position measurement. These inaccurate position measurements may be taken into account during position measurement by compensation of the effect of a defect on the position measurement.

This compensation may be performed by estimating the phase error in an output signal of the encoder head EH due to the defect in the grid plate GP and compensating for this phase error. For such compensation, the expected phase error may be predicted by a defect kernel which is based on the forward impulse responses of the encoder head EH in combination with a reflectivity profile of the grid plate. In such embodiment, the reflective profile is used as input for the defect kernel and the output of the defect kernel provides information on the effect of a defect in the grid plate.

An example of a defect kernel is given hereinafter. This defect kernel may be used to determine a defect on a grid plate GP and/or to compensate for a known defect on the grid plate. A defect is defined as a local variation in the reflectivity of the grid plate. This variation can have several sources. The amount of absorption is denoted by η(x,y). This value can vary between 0-1, corresponding to no defect and a full absorbing defect.

The output signals of the three detectors DET are combined in a single phase output signal Φ. Each encoder contains two channels with different sensitivity vectors, which are denoted by A and B. The phase errors of output signals A and B can be computed by a convolution of the defect η(x,y) with the impulse response of the encoder:

$$r_{\Phi_A}(x,y,R_x) = \eta(x,y) \otimes h_{\Phi_A}(x,y,R_x),$$

$$r_{\Phi_B}(x,y,R_x) = \eta(x,y) \otimes h_{\Phi_B}(x,y,R_x),$$

where $h_{\Phi_A}(x,y,R_x)$ and $h_{\Phi_B}(x,y,R_x)$ represent the impulse responses of output signals A and B. The impulse responses for output signals A and B are defined as:

$$h_{\Phi_A}(x, y, R_x) = h_\Phi\left(x - \frac{x_s}{2}, y + \frac{y_s}{2}, R_x\right) + h_\Phi\left(x + \frac{x_s}{2}, y + \frac{y_s}{2}, R_x\right),$$

$$h_{\Phi_B}(x, y, R_x) = h_\Phi\left(x - \frac{x_s}{2}, y - \frac{y_s}{2}, R_x\right) + h_\Phi\left(x + \frac{x_s}{2}, y - \frac{y_s}{2}, R_x\right),$$

where $h_\Phi(x,y,R_x)$ represents impulse response for a single spot. The single spot impulse response is given by $$h_\Phi(x, y, R_x) = C \frac{R_x y}{\pi r^2} e^{-2\frac{x^2+y^2}{r^2}},$$

in which the defect constant C is defined by:

$$C = \frac{2P_\Phi}{SP_z}$$

In the above example the variations in the reflectivity of the grid plate in the y direction are given. It is remarked that the variations in reflectivity of the grid plate in other directions may be different. Thus, similarly, to the above relation, there is a relation for reflectivity of the grid plate in the x direction, or any other direction. To further improve the results of the method of the invention, variations in reflectivity in different directions may be determined, to determine defects on the grid plate.

Examples of numerical values for the constants in above equations are presented in Table 1.

TABLE 1

Constants defect model

| Symbol | Description | Value | Unit |
|---|---|---|---|
| R | 1/e2 beam radius | 0.7 | mm |
| $x_S$ | Distance between spots of same channel | 5.7 | mm |
| $y_S$ | Distance between spots of channel A and B | 2.34 | mm |
| $SP_y$ | Signal period y-direction | 512 | nm/period |
| $SP_z$ | Signal period z-direction | 5735.294 | nm/period |
| $P_\Phi$ | Signal period Φ | 16384 | counts/period |

The Lissajous radius is representative of the amount of light or radiation beam falling onto the detector. In case there is no defect, the normalized Lissajous radius equals 1. In case there is a defect the normalized Lissajous radius for output signals A and B is given by the convolution $$r_{I_A}(x,y) = 1 - \eta(x,y) \otimes h_{I_A}(x,y),$$

$$r_{I_B}(x,y) = 1 - \eta(x,y) \otimes h_{I_B}(x,y),$$

where $h_{I_A}(x,y)$ and $h_{I_B}(x,y)$ represent the impulse responses of output signals A and B. The impulse responses for output signals A and B are defined as $$h_{I_A}(x, y) = h_I\left(x - \frac{x_s}{2}, y + \frac{y_s}{2}\right) + h_I\left(x + \frac{x_s}{2}, y + \frac{y_s}{2}\right),$$

$$h_{I_B}(x, y) = h_I\left(x - \frac{x_s}{2}, y - \frac{y_s}{2}\right) + h_I\left(x + \frac{x_s}{2}, y - \frac{y_s}{2}\right),$$

For a Gaussian irradiance distribution, the impulse response of a single spot is given by $$h_I(x_M, y_M) = \frac{2}{\pi r_0^2} e^{-2\frac{x_M^2 + y_M^2}{r_0^2}}.$$

Above the forward impulse responses of the encoders are presented. Given a defect η(x,y) we can compute the position response and the normalized Lissajous radius. Now the measured reflectivity profiles $r_{I_A}(x,y)$ and $r_{I_B}(x,y)$ are used to compute the phase errors $r_{\Phi_A}(x,y)$ and $r_{\Phi_B}(x,y)$.

The measured reflectivity profiles do not only depend on the true defect η(x,y), but also on additive measurement noise $n_{I_A}(x,y)$ and $n_{I_B}(x,y)$. The Wiener kernel may be used as a method to include this measurement noise in the design of the defect kernel.

A first step is to compute frequency response function (FRF) corresponding to $h_{I_A}$ and $h_{I_B}$, which are defined by $$H_{I_A}(\omega_x,\omega_y) = fft2(h_{I_A}(x,y))$$

and $$H_{I_B}(\omega_x,\omega_y) = fft2(h_{I_B}(x,y)).$$

The FRF of impulse response of $h_{\Phi_A}$ and $h_{\Phi_A}$ are defined as $$H_{\Phi_A} = fft2(h_{\Phi_A})$$

$$H_{\Phi_B} = fft2(h_{\Phi_B})$$

Given the power spectra of the position error $\phi_\Phi$ and the additive noise $\phi_n$ on the intensity signal, the Wiener estimate of the FRF of the defect kernel is defined as:

$$H_{I_A 2\Phi_A}(\omega) = \frac{H\phi_{\Phi_A}}{|H|^2 \phi_{\Phi_A} + \phi_n}$$

in which $$H(\omega) = H_{\Phi_A}^{-1} H_{I_A}.$$

The impulse response of this filter $h_{I_A 2\Phi_A}$ can be found by transforming $H_{I_A 2\Phi_A}$ back to the spatial domain.

$$h_{I_A 2\Phi_A} = ifft2(H_{I_A 2\Phi_A}).$$

A convolution of this defect kernel with the reflectivity profile gives an estimate for the phase errors, $$r_{\Phi_A} = h_{I_A 2\Phi_A} \otimes r_{I_A}.$$

It is noted that to compute the defect filter numerical fast Fourier transformation can for instance be applied, which assumes periodic boundary conditions. These periodic conditions are incorrect for the present application. As a result, the estimated kernel may be inaccurate around its boundaries. To provide a solution for this problem, the defect filter may be truncated using a Lanczos correction. This correction involves the multiplication with a sinc function before the actual truncation.

The above described defect kernel will provide a useful estimation of the phase error due to an effect in the grid plate and may therefore be used to compensate for position errors due to defects in the grid plate GP. However, any other defect model may also be used for detection and/or compensation of a defect in a grid plate GP.

In an alternative embodiment of a method to determine a defect map of the grid plate, defects in the grid plate may be determined by determining at least two position error maps for at least two different angles of the two or more detectors with respect to the grid plate and extracting a defect map from the at least two position error maps. To determine position error maps, a method as described in U.S. patent application Ser. No. 11/006,970, the contents of which are herein incorporated by reference in its entirety, may be used.

In the method of U.S. patent application Ser. No. 11/006,970, a position error map may be obtained by:
a) moving, in response to a setpoint signal, a stage relative to an encoder grid plate, a position of the stage being controlled by a stage controller;
b) measuring during the moving the position of the stage by a sensor head cooperating with the encoder grid; and
c) registering a signal representative of a difference between the setpoint signal and the position of the stage as measured by the sensor head.

On the basis of this registered signal a position error map may be determined. When position error maps are determined for at least two different angles of the encoder head with respect to the grid plate, a defect map can be extracted from the at least two position error maps. In this example, the variations in reflectivity are determined by changing an angle of the encoder head with respect to the grid plate between measurements of two position error maps. As a result, variations in the position error maps measured from the two different angles may be determined. However, the variation in position error maps, resulting from reflectivity of the grid plate, may depend on the angle in which this movement from the first angle to the second angle is made. For instance, a rotation Ry about the y-axis may result in determination of a defect due to a change in one of the measured position error maps. However, a rotation Rx over the same angle, but about the x-axis, i.e. perpendicular to the rotation Ry may result in determination of no defect at the same location, since the measured two position error maps will be the same.

Since defects may only occur in one direction, an embodiment of the method may include determining a third position error map for an other angle of the two or more detectors with respect to the grid plate, wherein the angle is in another plane than the first two angles, and extracting a defect map from the three position error maps. By determining a third position error map at another angle than the other two angles, the resulting defect map includes information on the effect of rotation about two orthogonal axes.

In an embodiment the third angle is substantially perpendicular to the plane of the first two angles.

For instance, the first two angles may relate to a rotation about the y-axis, i.e. a rotation in the x-z plane, and the third angle may relate to a rotation about the x-axis, which is perpendicular to the y-axis, i.e. a rotation in the y-z plane. The resulting defect map includes information on rotations about both the x-axis and the y-axis.

The tilt required for measurement of the effects between different angles may require the encoder head to be tilted with respect to the grid plate. The effect measured by such tilt may not only be caused by the actual change in angle of the encoder head, but also on the internal offset of the encoder head. Such internal offset of an encoder head may for instance be caused by the internal optical components of the encoder head, for instance due to tolerances of these internal components. Thus, when determining the effects of the tilt of an encoder head in the measurement of a position error map according to the above method, the method may include compensating for offset of internal components of the encoder head. The compensation may be based on any suitable offset information, for instance information obtained by calibration of the encoder head.

As an example, calibration of the offset of the encoder head may be carried out by the following steps: measuring intensity and position data on a known defect, and fitting the measured intensity data on the measured position data. Before the data is fitted the intensity data and position data may be filtered. In this calibration method any suitable known defect may be used. In an embodiment a deliberately manufactured defect may be used. When using such manufactured defect, the shape, size and location of the defect are known.

In an alternative embodiment of the calibration method, the shape of the defect may be used instead of the intensity data to determine the offset in the encoder head. The calibration may be carried out at a single angle of the encoder head with respect to the grid plate In an alternative calibration method, position data obtained at multiple angles, i.e. at least two angles for rotation in one direction, or at least three angles for rotation in multiple directions, could be used. Position data obtained at different angles provides sufficient information to calculate the effect of internal offset of the encoder head. The intensity data is in such embodiment not required.

Some encoder head measurement systems have encoder heads which together can determine the position of the grid plate with respect to the encoder head in more than the required degrees of freedom. For instance, a known embodiment of a position measurement system includes four encoder heads each configured to determine a position of the encoder head with respect to the grid plate in two degrees of freedom. For position measurement only three encoder heads are required. The fourth encoder head may be used to determine a position, in case one of the other three encoder heads are temporarily not positioned opposite the grid plate, but can also be used for calibration purposes.

In an embodiment of the above calibration method, the deliberately manufactured defect is arranged at a location wherein all four encoder heads are arranged opposite the grid plate when one of the encoder heads is arranged opposite the deliberately manufactured defect. As a result, the other three encoder heads may be used for position measurement and control, while the fourth encoder head is used for measuring position data of the defect. This has the benefit that the other three encoder heads can be arranged in a position control loop with a high bandwidth controller, without that the position data of the fourth encoder head result in bad control behavior. As a consequence, a better measurement signal for the position data measured by the fourth encoder head is obtained.

Hereinabove, embodiments of the invention have been explained with an encoder head EH including three detectors DET to receive signals on the basis of which the position of the encoder head EH with respect to the grid plate GP may be determined. Any other suitable encoder head having multiple detectors may also be used in other embodiments of the invention. Furthermore, an embodiment of the invention has been described wherein an encoder-type position measurement system is used to measure the position of a substrate table. Similar methods and devices may be used for an encoder-type position measurement system of other movable objects, in particular movable objects of a lithographic apparatus, such as a patterning device support.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method of determining a defect in a grid plate of an encoder-type position measurement system, the method comprising:
providing an encoder position measurement system to measure a position of a movable object with respect to another object, the encoder position measurement system comprising a grid plate and an encoder head, wherein the grid plate is mounted on a first of the movable object and the other object, and the encoder head is mounted on a second of the movable object and the other object, the encoder head comprising a radiation source configured to emit a radiation beam towards a measurement location on the grid plate and two or more detectors each configured to measure a quantity of said radiation beam reflected by the grid plate;
measuring a quantity of said reflected radiation beam received on each of the two or more detectors;
using a combined radiation beam intensity of the reflected radiation beam on the two or more detectors to determine a reflectivity signal representative of a reflectivity of the grid plate at the measurement location, and
determining a presence of a defect at the measurement location based on the reflectivity signal of the grid plate.

2. The method of claim 1, comprising measuring a reflectivity signal of the grid plate at multiple measurement locations to determine a reflectivity profile of the grid plate.

3. The method of claim 2, wherein the reflectivity signal of the grid plate at multiple measurement locations is used to determine a defect map of the grid plate.

4. The method of claim 3, wherein the defect map is used to compensate for defects during actual position measurement.

5. The method of claim 1, wherein determining a defect at a measurement location comprises comparing a measured reflectivity signal with a threshold.

6. The method of claim 1, wherein determining a defect at a measurement location comprises comparing a measured reflectivity signal with a previously measured reflectivity signal at the measurement location.

7. The method of claim 6, wherein the method comprises measuring the reflectivity signal of the grid plate at multiple measurement locations to determine a reflectivity profile of the grid plate, and wherein a defect is determined by comparing the reflectivity profile with a previously determined reflectivity profile of the grid plate.

8. The method of claim 1, wherein the combined radiation beam intensity is the total radiation beam intensity measured by the two or more detectors.

9. The method of claim 1, comprising, during position measurement, correlating an output of the encoder head and/or the reflectivity signal with an expected output of the encoder head and/or expected reflectivity signal to determine a defect on the grid plate.

10. The method of claim 9, wherein the expected output is based on previously measured encoder head outputs.

11. A position measurement method using an encoder position measurement system, comprising:
providing an encoder position measurement system to measure a position of a movable object with respect to another object, the encoder position measurement system comprising a grid plate and an encoder head, wherein the grid plate is mounted on a first of the movable object and the other object, and the encoder head is mounted on a second of the movable object and the other object, the encoder head comprising a radiation beam source configured to emit a radiation beam towards a measurement location on the grid plate and two or more detectors each configured to measure a quantity of said radiation beam reflected by the grid plate;

measuring a quantity of said reflected radiation beam received on each of the two or more detectors;

determining a position of the encoder head with respect to the grid plate based on the measured quantities of radiation, and compensating an effect of a defect in the grid plate in the measured position.

12. The method of claim 11, wherein the compensating comprises using the reflectivity of the grid plate to predict a phase error in a position measurement signal, and compensating the phase error.

13. The method of claim 12, wherein a defect kernel based on a forward impulse response of the encoder head is used to predict the phase error due to the defect.

14. The method of claim 11, wherein the compensating comprises using a defect determined by using a combined radiation beam intensity of the reflected radiation beam on the two or more detectors to determine a reflectivity signal representative of a reflectivity of the grid plate at the measurement location, and determining a presence of the defect at the measurement location based on the reflectivity signal of the grid plate.

15. A method of determining a defect in a grid plate of an encoder position measurement system, the method comprising:

providing an encoder position measurement system to measure a position of a movable object with respect to another object, the encoder position measurement system comprising a grid plate and an encoder head, wherein the grid plate is mounted on a first of the movable object and the other object, and the encoder head is mounted on the second of the movable object and the other object, the encoder head comprising a radiation source configured to emit a radiation beam towards a measurement location on the grid plate and two or more detectors each configured to measure a quantity of said radiation beam reflected by the grid plate;

determining two position error maps for two different angles of the two or more detectors with respect to the grid plate, and extracting a defect map from the two position error maps.

16. A lithographic apparatus comprising:

a support constructed to support a patterning device, the patterning device being capable of imparting a beam of radiation with a pattern in its cross-section to form a patterned radiation beam;

a substrate table constructed to hold a substrate;

a projection system configured to project the patterned radiation beam onto a target portion of the substrate, and a position measurement system configured to measure a position of a movable object of the lithographic apparatus, the position measurement system comprising an encoder system comprising a grid plate and an encoder head, the encoder head comprising a radiation source configured to emit a radiation beam and two or more detectors each configured to measure said radiation beam reflected by the grid plate at a measurement location, wherein the encoder system is configured to use a combined radiation beam intensity based on the reflected radiation beam measured by the two or more detectors to determine the reflectivity of the grid plate at the measurement location.

17. The lithographic apparatus of claim 16, wherein the encoder head comprises two channels with three detectors each.

18. The lithographic apparatus of claim 16, wherein the encoder head is configured to measure its position with respect to the grid plate in a direction substantially parallel to the grid plate and a direction substantially perpendicular to the grid plate.

19. The lithographic apparatus of claim 16, wherein the reflectivity of the grid plate is determined for measurement locations over the surface of the grid plate to measure a reflectivity profile of the grid plate.

20. The lithographic apparatus of claim 16, wherein the combined intensity is the total intensity of radiation beam received by the two or more detectors.

21. The lithographic apparatus of claim 16, wherein the movable object is the substrate table and/or the support constructed to support a patterning device.

22. The method of claim 1, wherein each of the two or more detectors is configured to measure an intensity of the reflected beam of radiation.

23. The method of claim 1, wherein each of the two or more detectors is configured to convert the quantity of reflected beam of radiation into an electrical signal.

* * * * *